(12) United States Patent
Goldsman et al.

(10) Patent No.: US 11,823,899 B1
(45) Date of Patent: Nov. 21, 2023

(54) FABRICATION OF A HIGH TEMPERATURE SILICON CARBIDE TRANSISTOR DEVICE

(71) Applicant: CoolCAD Electronics, LLC, College Park, MD (US)

(72) Inventors: Neil Goldsman, Takoma Park, MD (US); Akin Akturk, Gaithersburg, MD (US); Zeynep Dilli, Rockville, MD (US); Mitchell Adrian Gross, Baltimore, MD (US); Aysanew Abate, Washington, DC (US)

(73) Assignee: CoolCAD Electronics, LLC, College Park, MD (US)

( * ) Notice: Subject to any disclaimer, the term of this patent is extended or adjusted under 35 U.S.C. 154(b) by 274 days.

(21) Appl. No.: 17/231,608

(22) Filed: Apr. 15, 2021

Related U.S. Application Data

(60) Provisional application No. 63/089,591, filed on Oct. 9, 2020.

(51) Int. Cl.
*H01L 21/02* (2006.01)
*H01L 21/28* (2006.01)

(52) U.S. Cl.
CPC .. *H01L 21/02529* (2013.01); *H01L 21/02612* (2013.01); *H01L 21/28158* (2013.01)

(58) Field of Classification Search
CPC ......... H01L 21/02529; H01L 21/02612; H01L 21/28158
See application file for complete search history.

(56) References Cited

U.S. PATENT DOCUMENTS

| | | | |
|---|---|---|---|
| 2013/0178031 A1* | 7/2013 | Ramkumar | H10B 43/40 257/E21.423 |
| 2014/0057461 A1* | 2/2014 | Shiomi | H01L 21/324 438/796 |

* cited by examiner

*Primary Examiner* — Samuel A Gebremariam
(74) *Attorney, Agent, or Firm* — NovoTechIP International PLLC

(57) ABSTRACT

A high-temperature silicon carbide device, along with an integrated circuit including the device and method of fabricating the device are described. For example, the method includes forming one of a source region and a drain region of a silicon carbide metal-oxide-semiconductor device. The method may include forming a gate structure adjacent to either one of the source region and the drain region. The gate structure may include an insulating layer. The method may further include forming the insulating layer with a first growth step performed in a pure oxygen environment and with a second growth step performed in a nitrous oxide environment.

17 Claims, 11 Drawing Sheets

FABRICATION OF A HIGH TEMPERATURE SILICON CARBIDE TRANSISTOR DEVICE

BACKGROUND

The present disclosure relates to silicon carbide (SiC) circuits, including, without limitation, metal-oxide-semiconductor field effect transistor (MOSFET) devices, their fabrication methods, and circuit topologies including these devices. In addition, without limitation, the present disclosure relates to integrated circuits that include silicon carbide as an operative material and their fabrication methods. Furthermore, the background description provided herein is for the purpose of generally presenting the context of the disclosure. The work of the presently named inventors, to the extent it is described in this background section or elsewhere, as well as aspects of the description that may not otherwise qualify as prior art at the time of filing, are neither expressly nor impliedly admitted as prior art against the present disclosure.

The current state of the art integrated operational amplifier circuits are composed of silicon based electronics that can only operate up to approximately 200 degrees C. Analog circuits composed of SiC have been fabricated using junction gate field-effect transistor (JFET) based transistor technology that can operate at very high temperatures. However, JFETs require negative voltage between the gate and source making them difficult for DC biasing and direct coupling of input signals. In addition, the JFET gate is a reverse biased PN junction which suffers from leakage current. The MOSFET transistor has virtually zero gate input signal leakage current and virtually infinite input resistance, which is the ideal for a voltage amplifier. However, the current state-of-the-art in SiC MOSFET fabrication does not allow for SiC MOSFETs that can operate reliably at high temperatures for long periods of operation.

SUMMARY

The embodiments presented herein feature the design and fabrication of silicon carbide MOSFET devices and integrated circuits thereof that can operate at temperatures in excess of about 400 degrees Celsius. The embodiments featured herein include novel SiC component structures that yield MOSFETs having operational performance at temperatures exceeding about 400 degrees Celsius. The component structures, as well as the novel fabrication processes described herein, confer the aforementioned MOSFETs their unique ability to perform at higher temperatures. The present disclosure thus features a comprehensive framework for fabricating the aforementioned SiC MOSFETs as well as integrated circuits thereof. Generally, the disclosure features aspects of the fabrication of and integrated circuit implementations of SiC MOSFETs. A non-exhaustive set of exemplary and non-limiting embodiments is described below. One of ordinary skill in the relevant art(s) will readily understand that these embodiments may be adapted in more complex fabrication processes and/or in more complex integrated circuits, and this, without departing from the teachings featured herein.

In one embodiment, there is provided a method for fabricating a silicon carbide metal-oxide-semiconductor device. The method includes forming one of a source region and a drain region of the silicon carbide metal-oxide-semiconductor device. The method can further include forming a gate structure adjacent to either one of the source region and the drain region. The gate structure can further include an insulating layer. The method further includes forming the insulating layer with a first growth step performed in a pure oxygen environment and with a second growth step performed in a nitrous oxide environment.

In another embodiment, there is provided a method for fabricating a silicon carbide metal-oxide-semiconductor device. The method includes forming an insulating layer adjacent to either one of a source region and a drain region of the silicon carbide metal-oxide semiconductor device. In forming the insulating layer, the method can include growing the insulating layer to a first thickness in a first growth step providing oxygen to enable a growth of the insulating layer to the first thickness. The method can further include continuing the growth in a second growth step to a second thickness. Furthermore, the method can include continuing the growth in the second growth step to allow a continued growth by providing oxygen. The method further includes, in the second growth step, passivating one of an oxide trap and an interface state or both by providing nitrogen.

In yet another embodiment, there is provided a method for fabricating a silicon carbide metal-oxide-semiconductor device. The method includes forming one of a source region and a drain region of the silicon carbide metal-oxide semiconductor device. The method further includes forming either one of the source region and the drain region by doping a specified region of a silicon carbide substrate at a first temperature greater than about 500 degrees Celsius. The doping can include performing at least one doping step. The method can further include annealing the silicon carbide substrate, subsequent to the at least one doping step. The method can include annealing with a procedure conducted at a second temperature greater than about 1650 degrees Celsius. The method can further include forming a gate structure adjacent to the one of the source region and the drain region. The gate structure can include an insulating layer. The method can include forming the insulating layer at at least about 1100 degrees Celsius. Furthermore, forming the gate structure includes growing the insulating layer with a first growth step performed in a pure oxygen environment and with a second growth step performed in a nitrous oxide environment.

In yet another embodiment, the structure on top of the insulating layer is a layer of polycrystalline silicon of about 400 nm thick and degenerately doped with phosphorous. The polysilicon gate overlaps the source and drain regions to reduce gate-source and gate-drain leakage current. Furthermore, in yet another embodiment of the high temperature MOSFET is degenerately doped body structure that surrounds the gate, source and drain. This body structure increases gate control and mitigates source-drain leakage currents.

In this embodiment, semiconductor contacts are fabricated on the source, drain, body and gate regions to apply voltages and allow currents to flow through the MOSFETs. Furthermore, on top of the contacts and the polysilicon gate is fabricated an insulating layer of SiO2 that is about one micron thick. On top of the insulating layer is a metal or conducting ceramic layer that is patterned using lithographic methods to form a network of electrical interconnects that allow electric current and voltages to pass between the SiC MOSFETs and resistors while operating at temperatures up to and greater than about 500° C. The metal or conducting ceramic have melting point well above the operating temperature of the electric circuit, are resistant to oxidation and interdiffusion, and have a coefficient of thermal expansion that is matched to the field oxide and the interlayer dielectric layers.

Furthermore, in yet another embodiment of the high temperature circuit are electronic resistors. These resistors are n-type implanted regions of specific dimensions and donor concentration in the p-type silicon carbide epitaxial layer. These resistors are connected to the other devices in the circuits using metal semiconductor contacts and interconnects. On top of the resistors and contacts is an insulating layer on which the high-temperature metallic or the conducting ceramic conductor network is formed that can operate regularly are temperatures up to 500 C and greater. The contacts and conducting network are connected using vertical openings in the insulating layer that are filled with the high-temperature conductors.

In yet another embodiment, there are provided additional layers of the high temperature conductors that form the electrical connections between SiC devices (MOSFETs and resistors). The conductor layers are separating by insulating layers for avoiding short circuits. Furthermore, vertical openings or vias are established in the insulating layers in locations where electrical connections between conductor network layers are required for circuit operation. The vias are filled with metals or conducting ceramics that can operate at the high temperature and have coefficients of thermal expansion that are matched to those of the insulating layers to help avoid damage and maintain functionality when the SiC based integrated circuits are exposed to and operate in alternatingly high temperature and lower temperature environments.

In yet another embodiment of the system is that the SiC MOSFETs, SiC Resistors and the alternative layers of metallic and/or conducting ceramic interconnects, that can operate at high temperatures, and insulators are organized in such a way, and with appropriate dimensions, to form electronic integrated circuits such as amplifiers, analog to digital converters, mixers and logic circuits.

DETAILED DESCRIPTION

Embodiments will be described below in more detail with reference to the accompanying drawings. The following detailed descriptions are provided to assist the reader in gaining a comprehensive understanding of the methods, devices, circuits, and/or systems described herein as well as modifications thereof. Accordingly, various modifications and equivalents of the methods, devices, circuits, and/or systems described herein will be apparent to those of ordinary skill in the art. Descriptions of well-known functions, steps, and constructions may be omitted for increased clarity and conciseness.

Figure 1A:
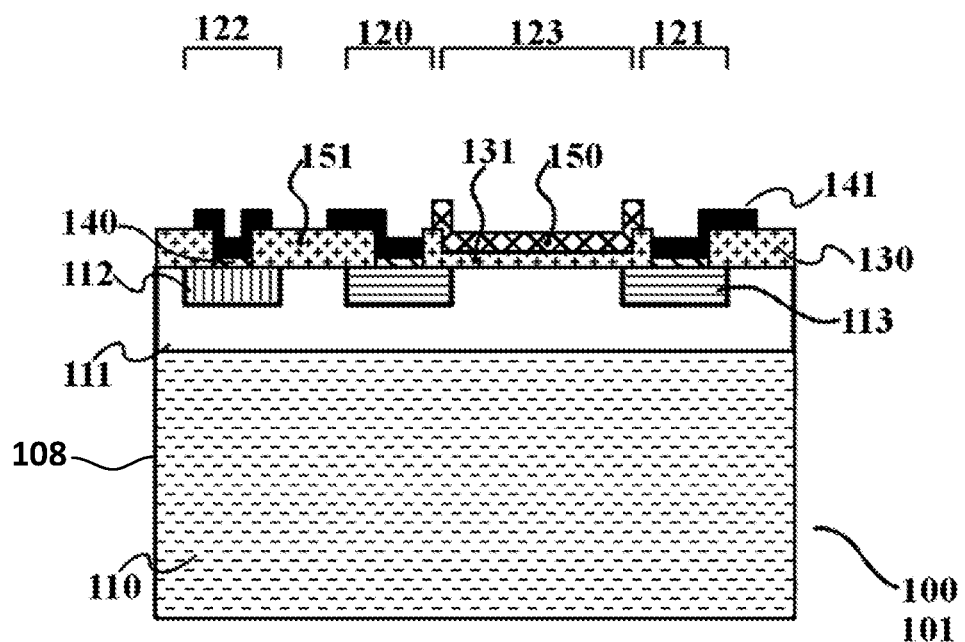
FIGS. 1A and 1B illustrate cross-sectional views of two silicon carbide devices according to various aspects described herein.
Figure 1B:
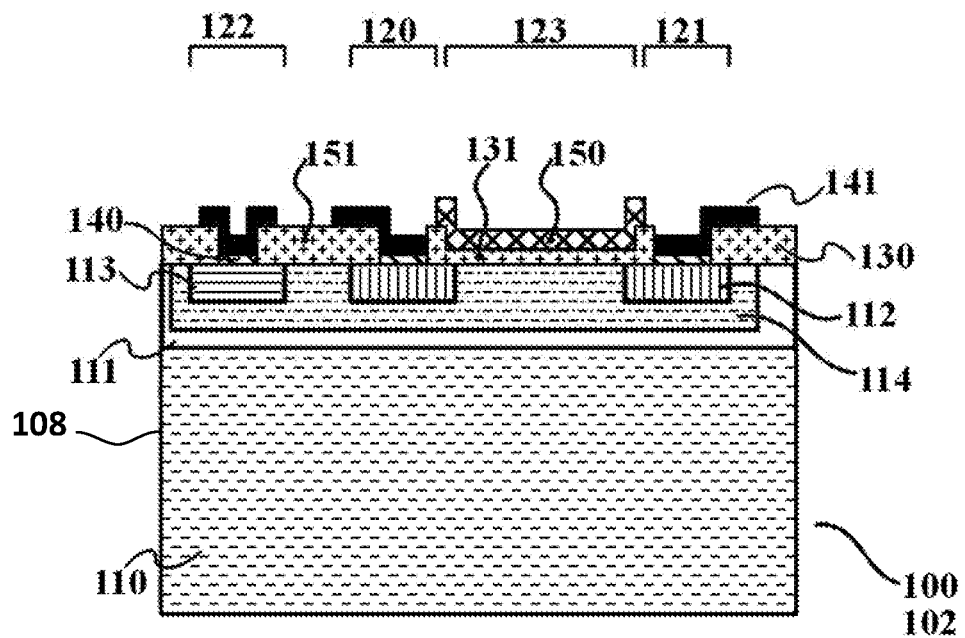

Furthermore, the terms used herein are intended to describe embodiments and shall by no means be restrictive. Unless clearly used otherwise, expressions in a singular form include a meaning of plural form. An expression such as "comprising" or "including" is intended to designate a characteristic, a feature, a step, an operation, an element, a particular material, a part or combinations thereof, and shall not be construed to preclude any presence or possibility of one or more other characteristics, features, steps, operations, elements, parts or combinations thereof FIGS. 1A and 1B illustrate cross-sectional views of two silicon carbide devices according to various aspects described herein. FIG. 1A illustrates the cross-section of an NMOS and FIG. 1B illustrates the cross-section of a PMOS. In FIG. 1A, the MOSFET 100 may be an NMOSFET 101, both of which are made in silicon carbide as the operative material. The NMOSFET 101 is formed on substrate 108 that includes an n-type bulk layer 110 having an epitaxial layer 111, which may be a p-type layer. The substrate 108 is described further below. In one embodiment, the epitaxial layer 111 may be substantially thinner than the region of the substrate 110 that is not epitaxial. In the epitaxial layer 111, there may be formed n+ type regions 113.

The n+ type regions 113 may be formed therein, for example and not by limitation, by ion implantation as shall be described in greater detail below. Furthermore, the epitaxial layer 111 may have p+ type regions 112 formed therein, also by ion implantation as a possible fabrication process. The n+ type regions 113 may be the source 120 or drain 121 regions of the NMOSFET 101, and the p+ type regions 112 may be the contact to the body of the NMOSFET 101. The epitaxial layer portion surrounding and between the source 120 and drain 121 regions of the NMOSFET 101 may form the body of the NMOSFET 101. The NMOSFET 101 may further include a gate structure 123 that includes an insulating layer (for example gate oxide) 131 and a gate material layer (for example gate polysilicon) 150. The NMOSFET 101 may further include field oxide regions 130 and 151, which may be made of silicon dioxide, for example and not by limitation. The NMOSFET 101 may further include a metal layer deposited to form ohmic contact metallic regions 140 that make the various electrical connections required to interface the NMOSFET 101 with other devices. These ohmic contact metallic regions 140 can further extend to interconnect metal layers to make such interfacing possible.

Turning now to FIG. 1B, where the MOSFET 100 is a PMOSFET 102, the cross-section illustrates generally the same structure. However, the PMOSFET 102 includes a n-well region 114, which forms a local substrate in the epitaxial layer 111 for the PMOSFET 102. Here, the source 120 and the drain 121 regions may be formed with p+ type implants 112. Conversely, the body contact region 122 may be formed using the n+ type implant 113. The portion of the n-well region 114 surrounding and between the source 120 and drain 121 regions may form the body of the PMOSFET 102.

FIGS. 1A and 2-10 illustrate various fabrication aspects of the NMOSFET 101. One of ordinary skill in the relevant art(s) will readily understand that the described fabrication process steps for the NMOSFET 101 described herein can be applied to the fabrication of the PMOSFET 102 in FIG. 1B. For example, the process for fabricating the PMOSFET 102 can include adding the n-well implant 114, using the correct implant type for the source 120, drain 121, and body contact 122 regions, and using the appropriate photolithographic masks to fabricate the PMOSFET 102.

Figure 1C:
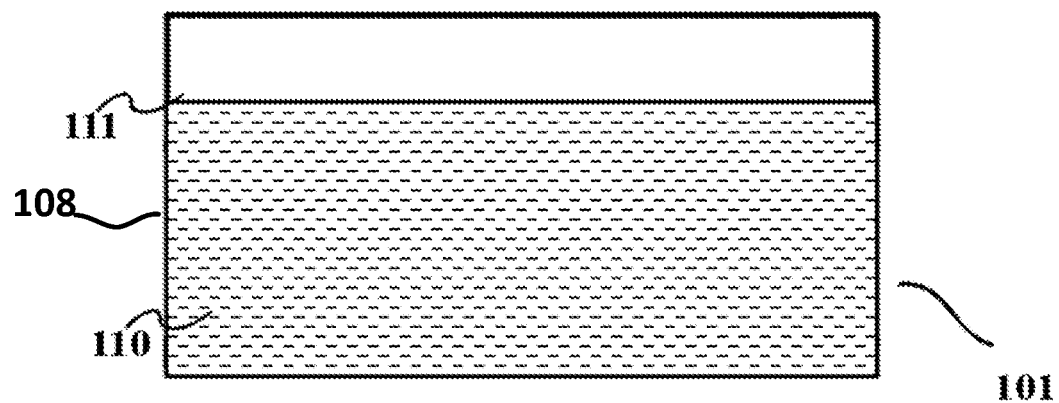
FIGS. 1C and 1D illustrate a fabrication process of a silicon carbide device according to various aspects described herein.
Figure 1D:
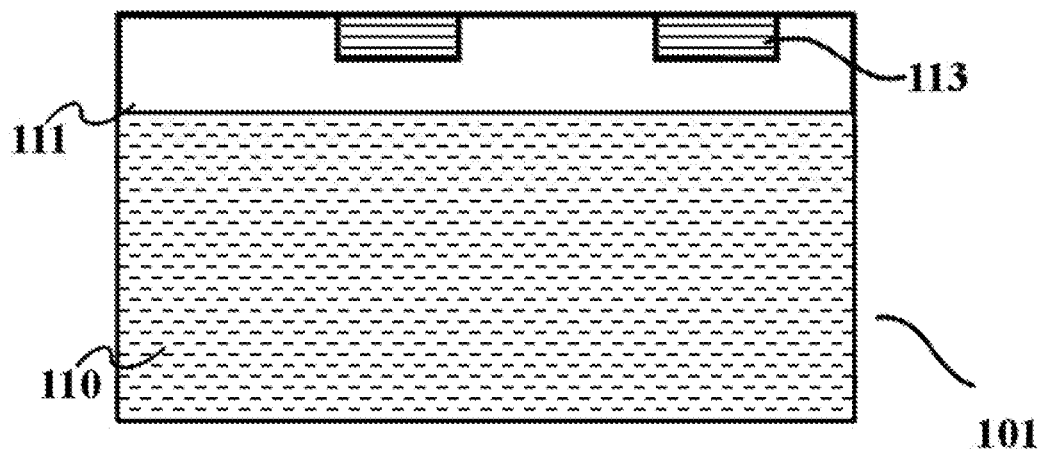

FIGS. 1C shows the bare semiconductor material from which the fabrication of the NMOSFET 101 may begin. The substrate 108, sometimes referred to as bare semiconductor material, typically includes a bulk layer 110 with an epitaxial layer 111. The bulk layer 110 may be, for example, and not by limitation, a 4H-SiC material. Other polytypes of SiC can be used for the bulk layer 110. For instance, 6H-SiC may be used or 3C-SiC may be used. Assuming that the epitaxial layer 111 is a p-type epitaxial layer, FIG. 1D shows the implantation of the source and drain implants 112, which may end up forming the source 120 and drain 121 regions of the NMOSFET 101.

Figure 2:
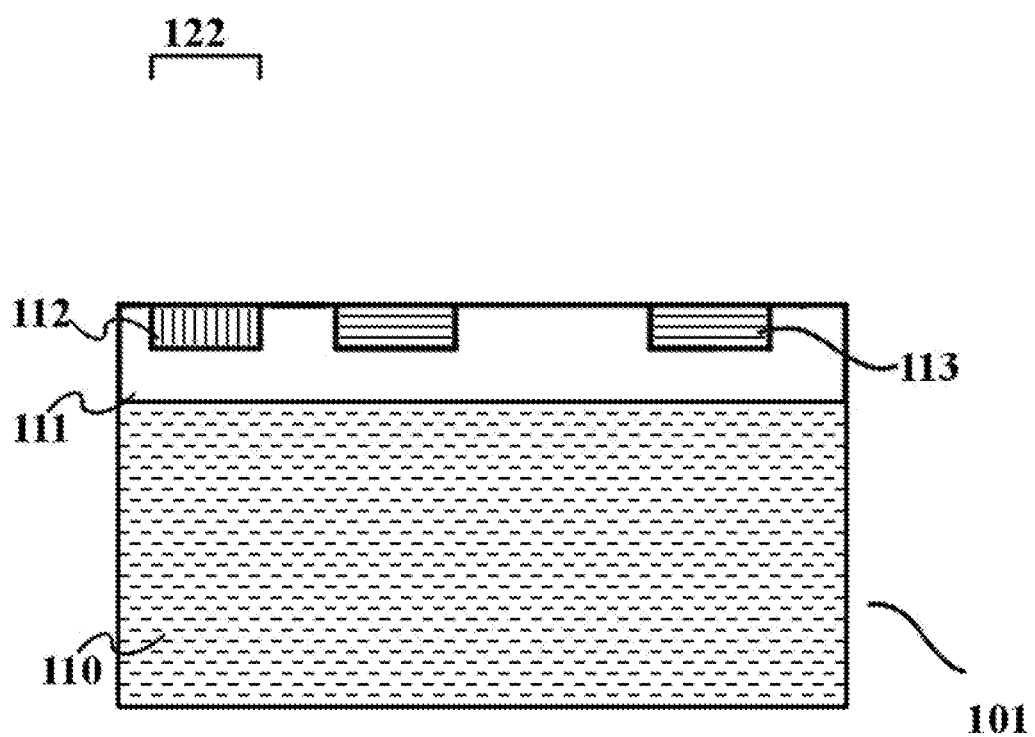
FIG. 2 illustrates a fabrication process of a silicon carbide device according to various aspects described herein.
Figure 3A:
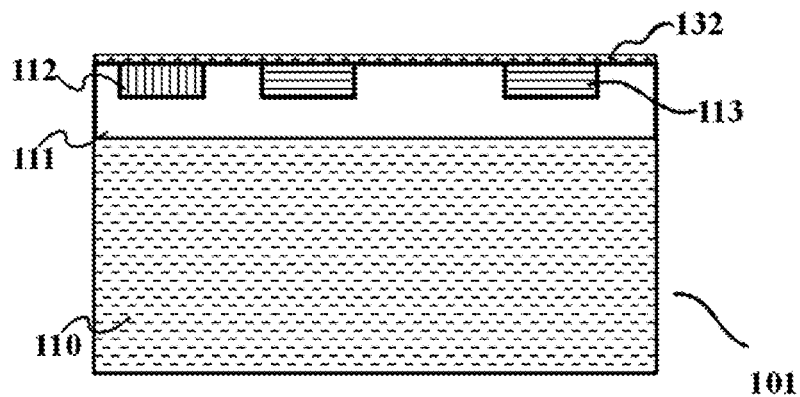
FIGS. 3A and 3B illustrate a fabrication process of a silicon carbide device according to various aspects described herein.
Figure 3B:
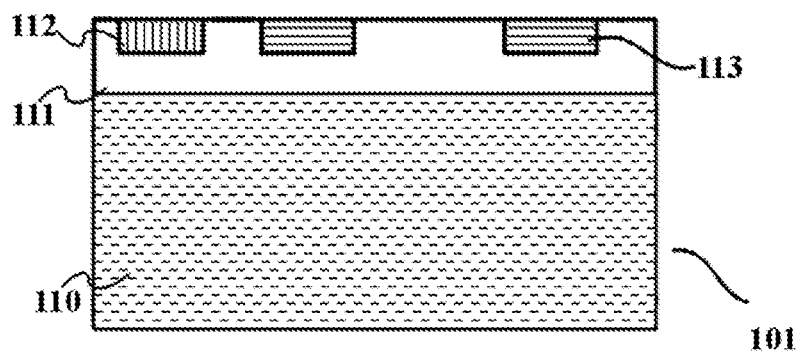

FIG. 2 illustrates the formation of the implantation of the p-type body contact 122 which may be made with the p+ implant 112. FIG. 3A then shows the growth of a sacrificial oxide 132, and FIG. 3B shows the removal of the sacrificial oxide 132. The sacrificial oxide 132 is a layer of native oxide SiO2 grown on the silicon carbide surface using a thermal oxide growth method known to those of ordinary skill in the art to a thickness exceeding 10 nm. The growth of the sacrificial oxide 132 has the effect of removing a surface layer of silicon carbide from the top surface epitaxial layer 111 on top of the bare semiconductor material by converting the SiC to SiO2. This process is applied to smooth the top surface of the epitaxial layer 111 and remove some imperfections, impurities and defects in the crystal which may be present near this top surface of the epitaxial layer 111. After the growth, the sacrificial oxide 132 is then removed, before any further processing steps are performed, by a wet etching method such as using a buffered oxide etch, or any other method that would be known to one of ordinary skill in the art.

Figure 4A:
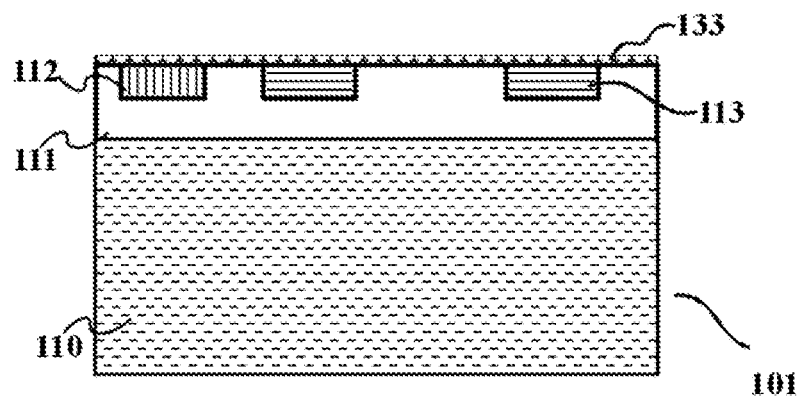
FIGS. 4A and 4B illustrate a fabrication process of a silicon carbide device according to various aspects described herein.
Figure 4B:
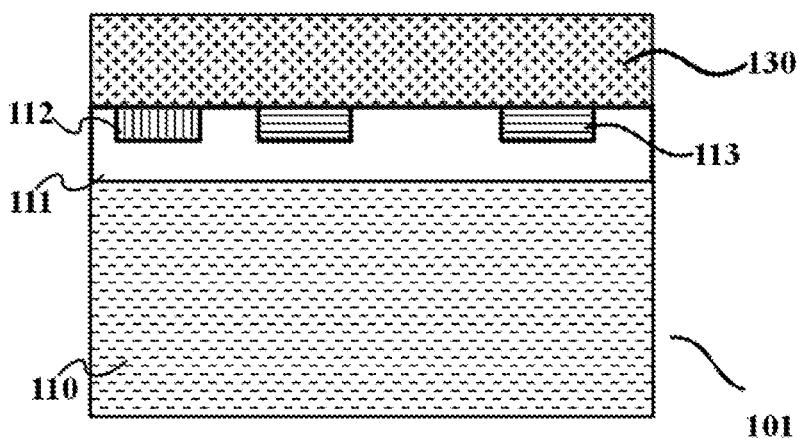
Figure 5A:
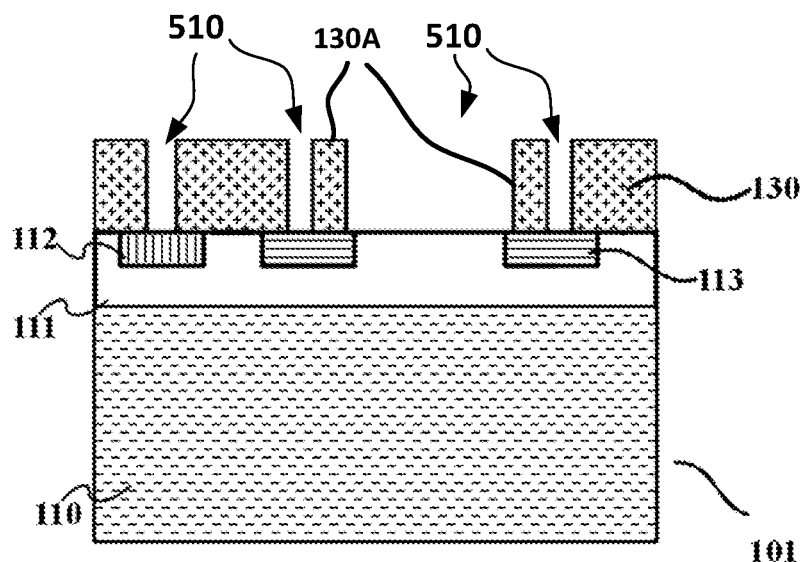
FIGS. 5A and 5B illustrate a fabrication process of a silicon carbide device according to various aspects described herein.
Figure 5B:
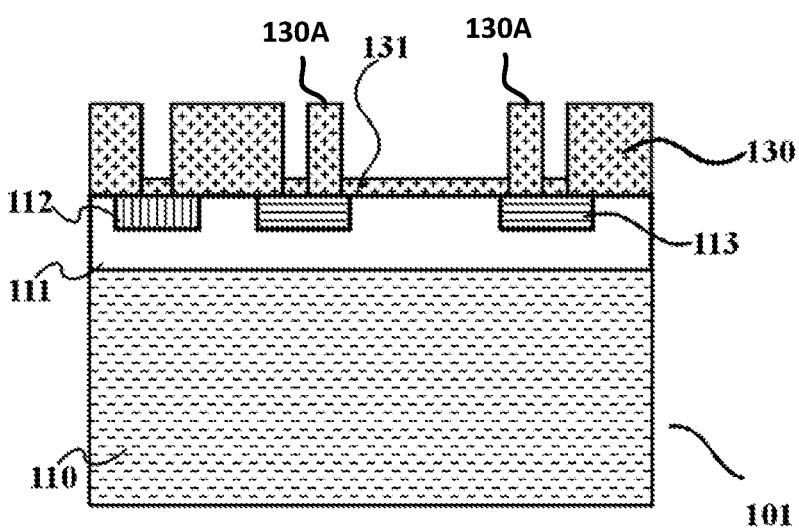

Following the removal of the sacrificial oxide 132, a surface passivation oxide 133 is grown thermally as shown in FIG. 4A to a thickness of between about 5 nm and 50 nm. In the illustrated implementation the thickness is about 30 nm. (Note the drawings are not to scale.) In one embodiment, the surface passivation oxide 133 is not removed from the surface before the deposition of field oxide 130, but for the clarity in the drawings, the surface passivation oxide is not shown in subsequent drawings. The surface passivation oxide 133 is grown using a thermal oxide growth method known to those of ordinary skill in the art. For example, and not by limitation, the semiconductor wafer may be placed in an oven into which an oxygen flow is introduced and maintained at a temperature of around 1100 C for a time period of around 3 hours. FIG. 4B shows the deposition of the field oxide 130. The field oxide 130 is deposited using a method such as PECVD (plasma-enhanced chemical vapor deposition) or another oxide deposition method known to those of ordinary skill in the art to a thickness of between about one-half and one micrometer. FIG. 5A shows openings 510 that are created in the field oxide 130 to define regions for the gate, source, drain, and body contact regions of the NMOSFET 101. Note that in the example shown in FIG. 5B, portions of the field oxide 130A are left to stand near the boundaries of the source and drain regions which will face the channel region. In the example shown in FIG. 5A, the field oxide remnants 130A start just inside the source or the drain regions such that the gate oxide will overlap a small portion of the source and drain regions, and the gate layer material to be deposited later will largely be separated from the source and drain regions by the thickness of the field oxide remnants 130A, to reduce gate leakage current. FIG. 5B shows the growth of an insulating layer or the gate oxide 131, which will form the basis of the gate structure of the NMOSFET 101. Formation of the insulating layer 131, which is the gate oxide, is described further below.

Figure 6A:
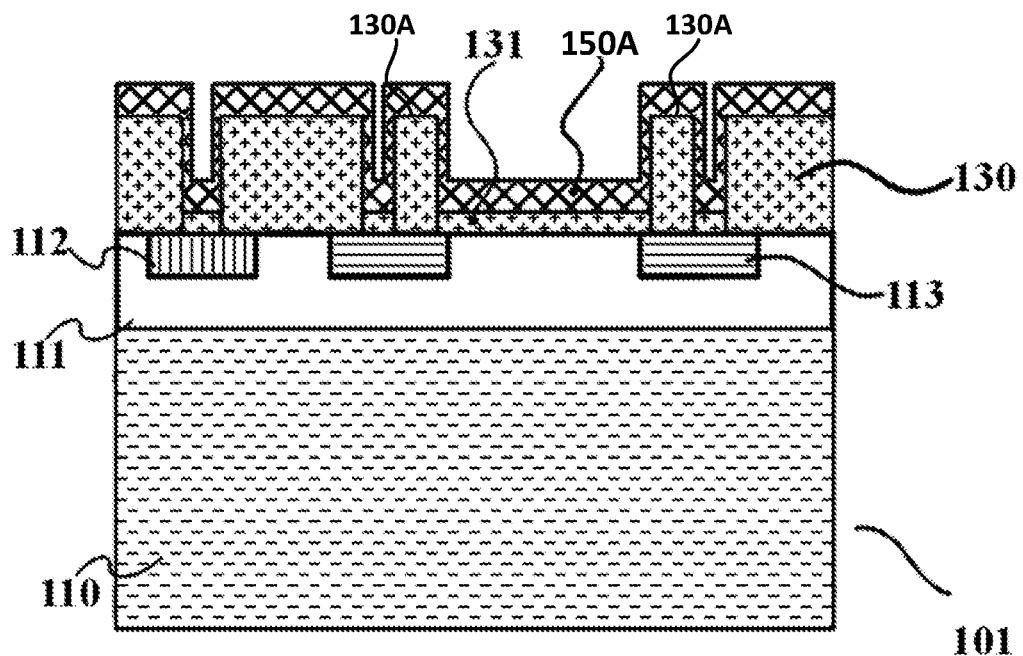
FIGS. 6A, 6B and 6C illustrate a fabrication process of a silicon carbide device according to various aspects described herein.
Figure 6B:
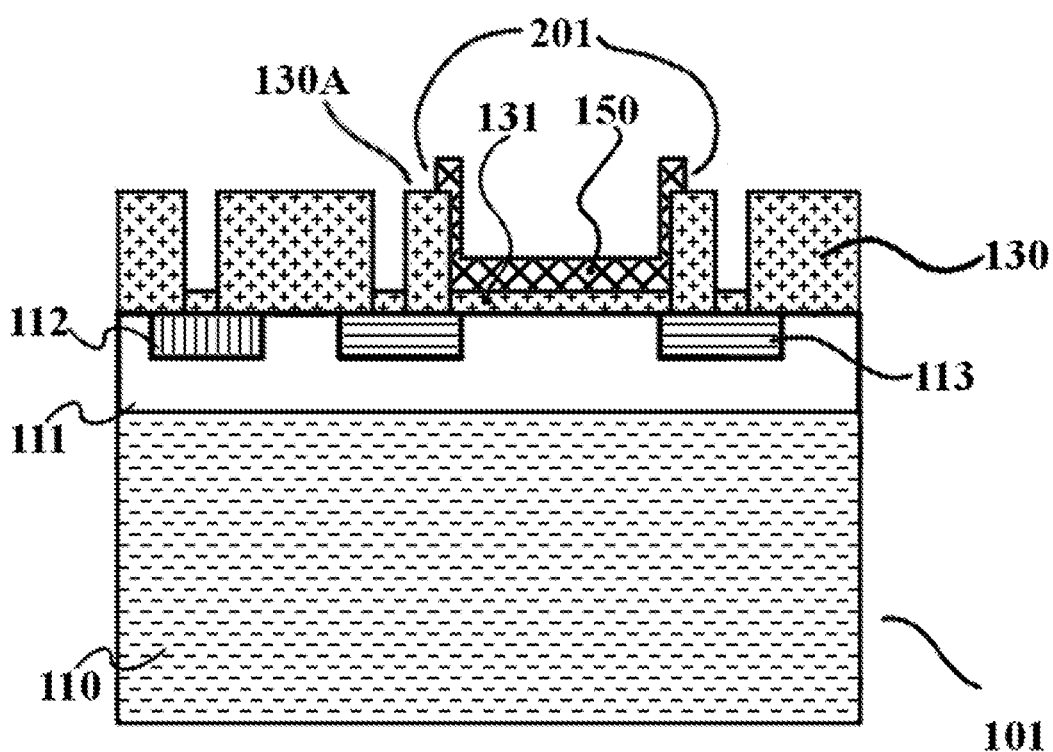

In FIG. 6A, a polysilicon layer 150A is deposited on the structure following the growth of the gate oxide 131. Following the deposition of the polysilicon layer 150A, the polysilicon layer 150A is doped, and drive-in anneal step is conducted in order to make the polysilicon layer 150A function as a MOSFET gate material layer. Note, only the final state of the structure is shown in FIG. 6A following these steps. FIG. 6B shows the completed gate structure of the NMOSFET 101 after the patterning of the polysilicon layer 150A to form the gate polysilicon 150, where the gate structure includes gate polysilicon 150 and the gate oxide 131. FIG. 6B further illustrates an additional feature where the gate polysilicon includes an overlap region 201 that climbs above and partially overlaps a portion 130A of the field oxide 130 near the edges of the source and drain implant regions 113 as shown. The purpose of the thick field oxide regions 130A and the overlap 201 is to reduce gate leakage current, since the presence of this oxide reduces the electric field between the gate material and the edges of the source and drain implant regions 113.

Figure 6C:
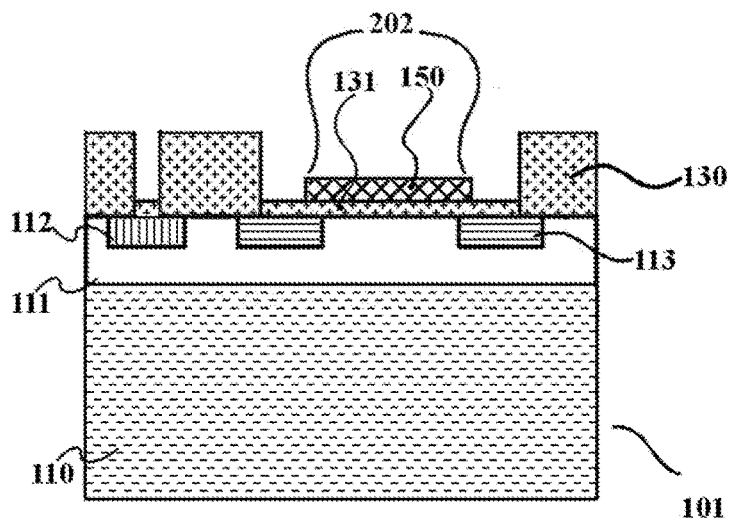

FIG. 6C shows an alternative structure that may be obtained by a modified fabrication process in place of the structure in FIG. 6A. In this modified fabrication process, the opening created for the gate oxide 131 by etching the field oxide 130 extends all the way between the source and drain regions 113, with no field oxide regions left in between. After the gate oxide 131 is grown with the same process as referred to by FIG. 5B, the polysilicon gate material 150 is then deposited and patterned so that its edges go beyond the edges of the source and drain regions 113 to either side of the channel region between them, to form the overlap regions 202. Thus, in this alternative, the gate material layer 150 is only formed over the insulating layer area between and partially overlapping the source and drain regions.

Figure 7A:
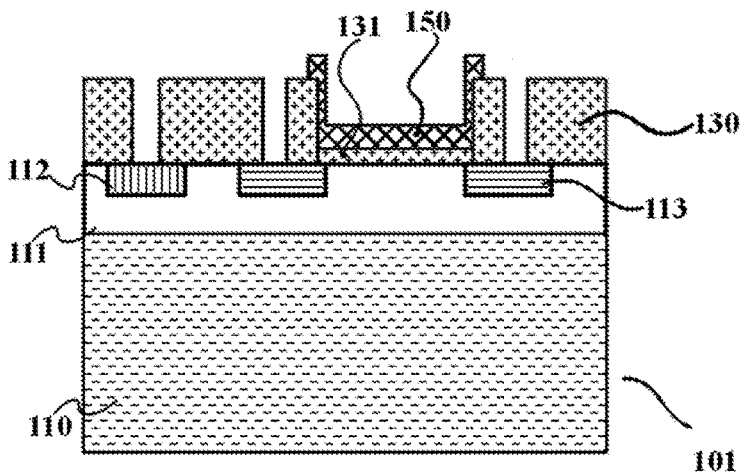
FIGS. 7A and 7B illustrate a fabrication process of a silicon carbide device according to various aspects described herein.
Figure 7B:
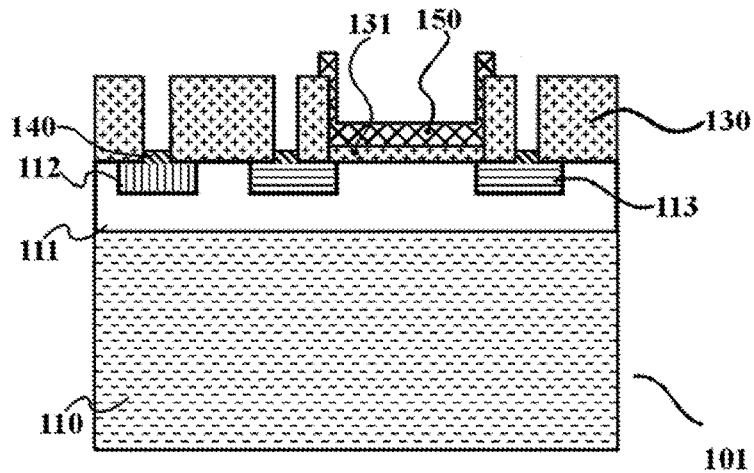

FIG. 7A shows the metallization procedure used for the NMOSFET 101 to create the ohmic contacts to the semiconductor. The gate oxide 131 remaining in the openings of the field oxide 130 is etched to form openings for the ohmic contact metal layer deposition as shown in FIG. 7A. In FIG. 7B, the ohmic contact metal layer has been deposited, patterned, and annealed to form the ohmic contact metallic regions 140. (Only the final stage is shown for conciseness.)

Figure 8A:
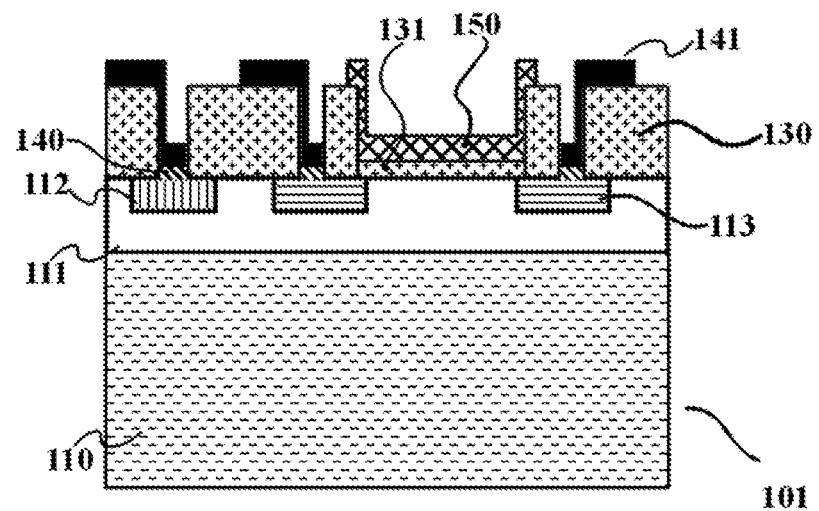
FIGS. 8A and 8B illustrate a fabrication process of a silicon carbide device according to various aspects described herein.
Figure 8B:
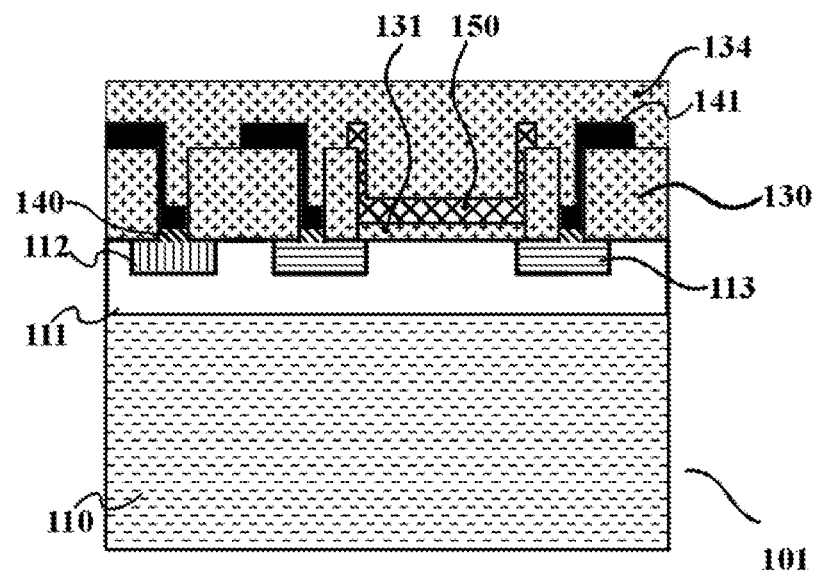
Figure 9A:
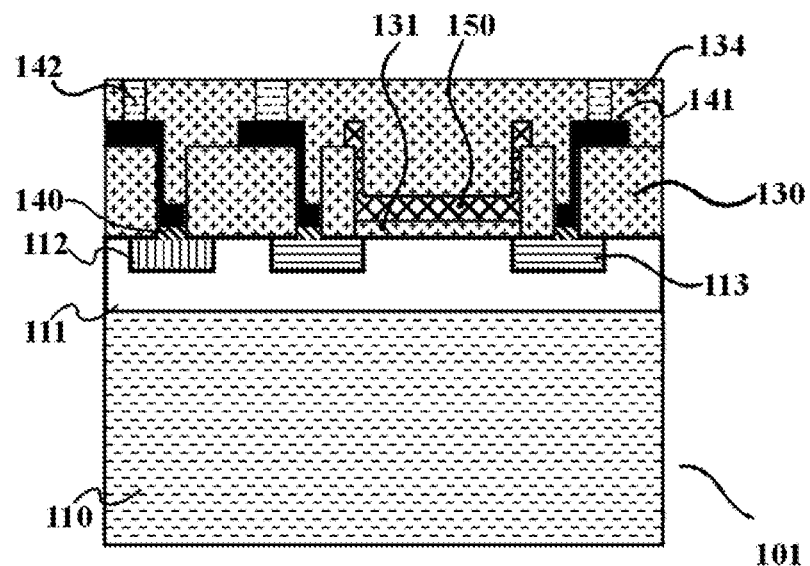
FIGS. 9A and 9B illustrate a fabrication process of a silicon carbide device according to various aspects described herein.
Figure 9B:
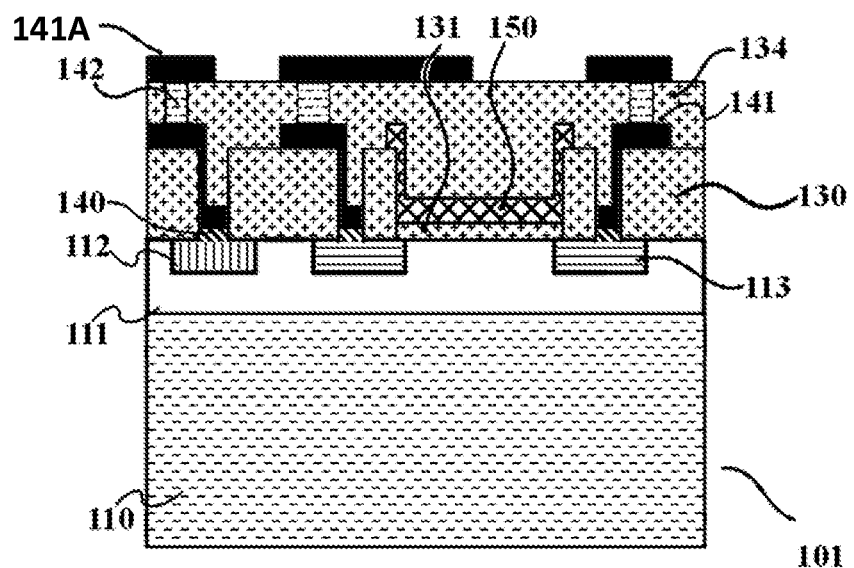

FIG. 8A shows the deposition of a first interconnect metal layer 141, which contacts the ohmic contact metal regions 140. Following the deposition of the metal layer 141, the metal layer 141 is patterned to form a desired interconnection network. In FIG. 8B, an inter-dielectric layer 134 is deposited. Furthermore, FIG. 9A shows the opening of vias in the inter-dielectric layer 134. Via materials 142 (e.g., a metal or a metal alloy), can then be deposited in the vias to contact the interconnect metal layer 141. A second metal interconnect layer 141A can be deposited, patterned, and annealed (FIG. 9B).

Figure 10A:
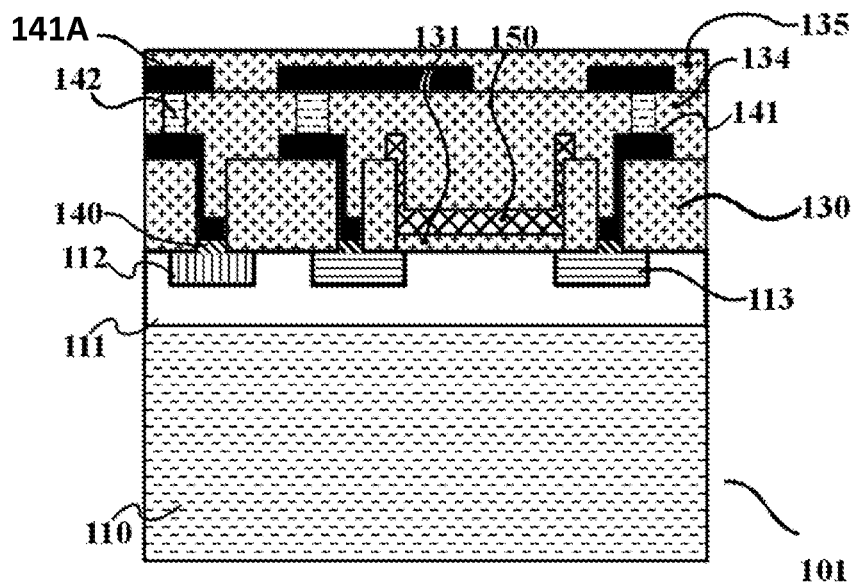
FIGS. 10A and 10B illustrate a fabrication process of a silicon carbide device according to various aspects described herein.
Figure 10B:
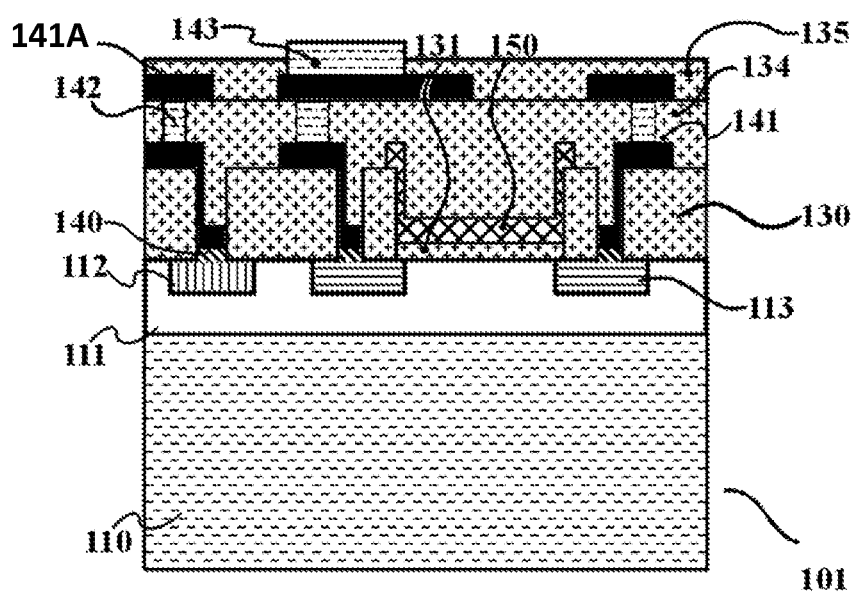

FIG. 10A shows the deposition of yet another inter-dielectric layer 135, on top of which additional metallic layers 143 may be patterned as shown in FIG. 10B. One of skill in the relevant art(s) will readily recognize that additional inter-dielectric layers and interconnect metal layers can be stacked on top of the structure to provide additional metal interconnection networks.

DEVICE STRUCTURE FOR HIGH TEMPERATURE OPERATION

Having described the fabrication process for either the NMOSFET 101 or the PMOSFET 102, according to an example implementation described above, additional details are now provided on the process. These additional details describe how specific and novel fabrication steps undertaken impart high-temperature functionality to the devices described. These details may be related to the fabrication process described above in order to engineer SiC MOSFETs capable of performing above temperatures exceeding about 400 degrees Centigrade.

In the embodiments described, above, the doping profile and ion implantation processes may be tuned as follows. Once the physical device designs are established masks for ion implantations may be fabricated. To achieve the desired doping profiles, multiple ion implantations may be performed. In some examples, three ion implantations are performed. The dose and energy of the implants is decided upon by a combination of simulation and measurements. Once the series of implants is complete, the donor and acceptor ions are activated using a rapid thermal anneal at high temperatures greater than 1600 C. The high temperatures are required since SiC has very strong atomic bonds and the dopants need to break the bonds to integrate into lattice sites.

The contemplated dopant species and profile is tuned to SiC MOSFETs; the N-type dopants for the source and drain is Nitrogen. The energy and dose of the implants are calibrated to form a specific profile as a function of depth. The P-type epitaxial layer is chosen to have a specific thickness and doping to allow for proper substrate doping for the MOSFET to exhibit the desired threshold voltage. The P-type epi is also used as an isolation region that isolates the N+ substrate from the device active area. In some embodiments, the N+ source and drains may be implanted at high temperatures of at least 500 C to minimize the introduction of defects that generate traps. The N+ source and drain doping level has to be sufficiently high to generate tunneling barriers that give rise to low resistance ohmic contacts with the Ti-Ni-Ti sandwich contact stack or another appropriate metallization stack. The body P+ implant also needs to be Aluminum. The dopants are chosen to provide optimal ionization as a function of both temperature and concentration.

MOSFET GATE OXIDE

Once the dopants are activated, the gate dielectric is grown using a process that gives rise to a high quality gate oxide, with a predetermined thickness (e.g. between 10 nm and 30 nm). The gate oxide is represented as gate oxide 131 in the figures. The gate oxide is grown by flowing carefully chosen, oxygen-rich gas over the SiC at approximately 1100 degrees Centigrade or higher in a furnace tube. The compound N2O may be used as a source for both oxygen and nitrogen because these elements are used in the growth process.

The gate oxide growth process in some implementations may be a multi-step process. For example, after approximately 85% of the gate oxide is grown in a pure O2 oxidation furnace at between 1150 C and 1250 C, a following step is introduced where the final approximately 15% of oxide growth is performed in N2O between 1200 C and 1300 C. The oxide growth mechanism is such that new oxide grows outwards from the interface between the surface of the SiC and the bottom edge of the newly-formed oxide layer. Therefore, the use of N2O in the second oxidation stage provides two things: (1) the oxygen for continued growth, (2) the nitrogen for surface passivation, where the surface passivation helps reduce imperfections such as near interface (shallow) oxide traps and interface states that can cause parasitic current flows. In addition, the nitrogen provides n-type counter-doping of the p-type substrate to increase transconductance and field-effect mobility. The targeted goal is to maximize the on-current of the MOSFET while minimizing the off-currents (i.e. leakage currents). The increased oxide quality and reduced number of interface states and oxygen traps near the surface also works towards this goal. The time of growth in the pure oxygen environments and the N2O environment is important to the process. The above process would likely be detectable by an analysis of the oxide layer that would show increasing nitrogen concentration within the oxide layers closer to the surface.

POLYSILICON GATE MATERIAL AND THE GATE STRUCTURE

A layer of polysilicon is typically deposited over the entire wafer using LPCVD or another deposition method as the gate material layer. In some embodiments, a highly doped polysilicon material may be directly deposited. In some embodiments, an undoped polysilicon material may be deposited, followed by one of a dopant implantation step, a spin-on dopant application step or a liquid precursor dopant application step, followed by a drive-in step or diffusion step designed according to the doping method. A lithography step is then performed to etch away the polysilicon except for over the MOSFET gate oxide areas. The contacts to SiC with the metals are formed as ohmic contacts using a high temperature annealing and silicide process. The contacts to polysilicon with the metals may be formed as ohmic contacts with or without using a high temperature annealing process.

Thus, the gate structure is comprised of an insulating layer in the form of the gate oxide and the gate material layer, which in some implementations is comprised of polysilicon.

The gate polysilicon 150 (FIG. 6B) is fabricated to facilitate high temperature operation, since it is not susceptible to diffusion of the gate material into the gate oxide. In addition, the polysilicon gate is fabricated in using two different approaches to help fend off sidewall gate leakage currents between the gate and the MOSFET source and drain. In one exemplary method the polysilicon gate 150 extends over segments of field oxide left covering the boundaries between the channel and the source and drain implants as shown in FIG. 6B, and in the other exemplary method as shown in FIG. 6C, the gate oxide extends past the polysilicon gate without any field oxide left over the aforementioned boundaries to insulate the sidewalls from leakage as shown in FIG. 6C.

METALLIZATION AND INTERLAYER DIELECTRIC

The first metal layer is deposited to cover all the ohmic contacts formed in the ohmic contact metal layer and patterned to form the first layer of interconnects. For room temperature, a possible choice for the interconnect metal is aluminum. For high temperature processes, the metallization needs special consideration. A dielectric layer is then deposited to insulate the metal layers from each other. The deposition is achieved with a PECVD process. Vias (142 in FIG. 9A) to the first metal layer may be connected to a second metal using vertical openings which are etched in the insulating layer between the metal layers in the appropriate places. For room-temperature operation, the vias may include aluminum. For high temperature operation, special materials may be used.

The second metal layer (141 in FIG. 9B) is put down by e-beam deposition, for example and not by limitation, followed by a lift-off process for patterning. The second metal layer completes the routing of the circuit, establishing the final set of interconnects. In some implementations, for the formation of more complex circuits, a larger number of metal layers may be used with similar interlayer dielectrics and vias in between. A final lithography step is then performed, and an additional metal is added to the contact pads to strengthen them for eventual probing and wire bonding. The pad metal may be gold or aluminum, by example and not by limitation. Alternatively, the pad metal may include a stack of multiple layers of different metals with each metal layer serving a different purpose. To perform the microlithography steps, a set of optical masks that establishes where each microscopic component should be during each step of the fabrication process is designed. There is typically an optical mask for each major fabrication step, including an individual mask for each set of ion implants.

The process described above for SiC circuit fabrication will typically be approximately twelve or thirteen optical masks, depending on the number of different ion implant profiles that need to be performed. The masks may be designed with the aid of an integrated circuit layout tool. The layouts are converted into a format that is suitable for mask fabrication and are saved as GDS-II files, for example, and not by limitation.

Having described in detail several fabrication processes, either in part or in whole, several additional embodiments consistent with those teachings are now described generally to provide additional examples of various possible implementations. One of ordinary skill in the relevant art(s) will readily understand that these embodiments may be adapted and/or altered to yield other types of devices (e.g., JFETs, IGBTs, etc.) without departing from the scope contemplated in the instant disclosure.

In one embodiment, there is provided a method for fabricating a silicon carbide metal-oxide-semiconductor device. The method includes forming one of a source region and a drain region of the silicon carbide metal-oxide-semiconductor device. The method can further include forming a gate structure adjacent to either one of the source region and the drain region. The gate structure can further include an insulating layer. The method further includes forming the insulating layer with a first growth step performed in a pure oxygen environment and with a second growth step performed in a nitrous oxide environment.

In the method, the SiC substrate may include an epitaxial layer and a bulk region. The epitaxial layer may be a p-type layer, and the bulk region may be an n-type region. The source region or the drain region may be an n-type region. The n-type region may include nitrogen as a dopant. The method may further include forming a body region in the epitaxial layer which may include performing a p-type doping step in the epitaxial layer. For example, the doping may include doping the body region with aluminum. The method may further include including generating a predetermined profile with a predetermined dopant concentration as a function of depth to form the source or the drain region. Furthermore, the method may include removing a top layer of SiC due to thermal growth of one of a sacrificial oxide, a passivation oxide, and a gate oxide.

In the exemplary method, forming the gate structure may include growing the insulating layer in a first growth step at a first growth temperature, wherein the first growth steps yields a first thickness of insulating material, and in a second growth step at a second growth temperature, where the second growth steps increases a thickness of the insulating material to a second thickness greater than the first thickness. The first temperature may be lower than the second temperature. Furthermore, forming the gate structure may include growing the insulating layer to a total thickness of about 20 nanometers. The method may further include depositing a gate material layer onto the insulating layer.

In another embodiment, there is provided a method for fabricating a silicon carbide metal-oxide-semiconductor device. The method may include forming an insulating layer adjacent to either one of a source region and a drain region of the silicon carbide metal-oxide semiconductor device. In forming the insulating layer, the method may include growing the insulating layer to a first thickness in a first growth step providing oxygen to enable a growth of the insulating layer to the first thickness. The method may further include continuing the growth in a second growth step to a second thickness. Furthermore, the method may include continuing the growth in the second growth step to allow a continued growth by providing oxygen. The method may further include, in the second growth step, passivating one of an oxide trap and an interface state or both by providing nitrogen.

In the exemplary method, the total thickness of the insulating layer may be about 20 nanometers and the first thickness may be about 85 percent of the total thickness. The first growth step may be conducted at a first temperature, and the second growth step may be conducted at a second temperature higher than the first temperature. The method may further include depositing a doped polysilicon layer on the insulating layer.

In yet another embodiment, there is provided a method for fabricating a silicon carbide metal-oxide-semiconductor device. The method includes forming one of a source region and a drain region of the silicon carbide metal-oxide semiconductor device. The method further includes forming either one of the source region and the drain region by doping a specified region of a silicon carbide substrate at a first temperature greater than about 500 degrees Celsius. The doping can include performing at least one doping step. The method can further include annealing the silicon carbide substrate, subsequent to the at least one doping step. The at least one doping step may include at least one ion implantation step. The method can include annealing with a rapid annealing procedure conducted at a second temperature greater than about 1650 degrees Celsius.

Although the drawings describe operations in a specific order and/or show specific arrangements of components and are described in the context of silicon carbide MOSFETs, one should not interpret that such specific order and/or arrangements limit the scope of the present disclosure, or that all the operations performed and the components disclosed are needed to obtain a desired result.

What is claimed is:

1. A method for fabricating a silicon carbide (SiC) metal-oxide-semiconductor (MOS) device, the method comprising:
   forming a source region and a drain region of the SiC MOS device in a SiC substrate;
   forming a gate structure adjacent to the source region and the drain region, the gate structure including a gate material layer deposited on an insulating layer;
   wherein forming the gate structure includes growing the insulating layer with a first growth step performed in a pure oxygen (O2) environment and with a second growth step performed in a nitrous oxide (N2O) environment;
   wherein the first growth step is at a first growth temperature and yields a first thickness of insulating material; and
   wherein the second growth step is at a second growth temperature and increases a thickness of the insulating material to a second thickness greater than the first thickness.

2. The method as set forth in claim 1, wherein the SiC substrate includes an epitaxial layer and a bulk layer.

3. The method as set forth in claim 2, wherein the SiC MOS device is an N-channel MOS device (NMOS).

4. The method as set forth in claim 3, further including forming a body contact region in the epitaxial layer with a p-type doping, wherein forming the body contact region includes doping the body region with aluminum.

5. The method as set forth in claim 2, wherein the SiC MOS device is a P-channel MOS device (PMOS).

6. The method of claim 1, further including generating a predetermined profile with a predetermined dopant concentration as a function of depth to form the one of the source and drain region, wherein the method further includes generating a predetermined profile with a predetermined dopant concentration as a function of depth to form a body contact implant region.

7. The method of claim 1, further including thermal growth of a sacrificial oxide, a passivation oxide, and a gate oxide on a surface of the SiC, where growth of the sacrificial oxide removes a top layer of the SiC.

8. The method as set forth in claim 1, wherein the first temperature is lower than the second temperature.

9. The method as set forth in claim 1, wherein forming the gate structure includes growing the insulating layer to a total thickness of about 20 to 30 nanometers.

10. The method as set forth in claim 1, wherein the gate layer material is polysilicon.

11. The method as set forth in claim 1, wherein the gate material layer on the insulating layer overlaps a portion of the source region and the drain region.

12. The method as set forth in claim 11, wherein an opening in a field oxide extends all the way across and between the source and drain regions and a gate material layer is only formed over the insulating layer area between and partially overlapping the source and drain regions.

13. The method as set forth in claim 11, wherein gate material layer covering the portion of the source and drain regions are bounded by structures of thicker field oxide which defines edges of a gate material layer opening both on a source side and a drain side boundary and wherein the gate material layer climbs above and partially overlaps a portion of the structures of thicker field oxide which overlap a portion of the source and drain regions.

14. A method for fabricating a silicon carbide (SiC) metal-oxide-semiconductor (MOS) device, the method comprising:
   forming an insulating layer adjacent to one of a source region and a drain region of the SiC MOS device, wherein forming the insulation layer includes:
   (i) growing the insulating layer to a first thickness in a first growth step providing oxygen to enable a growth of the insulating layer to the first thickness; and
   (ii) continuing the growth in a second growth step to a second thickness; and
   (iii) passivating one of an oxide trap and an interface state or both by providing nitrogen.

15. The method as set forth in claim 14, wherein a total thickness of the insulating layer is about 20 to 30 nanometers.

16. The method as set forth in claim 14, wherein the first growth step is conducted at a first temperature and the second growth step is conducted at a second temperature higher than the first temperature.

17. The method as set forth in claim 14, further comprising depositing a gate material to form a gate material layer onto the insulating layer, wherein the gate material layer comprises a doped polysilicon layer, and wherein said doped polysilicon layer is obtained by one of the following: a direct deposition procedure of doped polysilicon, an implantation procedure of doping polysilicon after a deposition of undoped polysilicon, and a diffusion procedure of doping polysilicon after a deposition of undoped polysilicon.

* * * * *